(12) United States Patent
Tadera et al.

(10) Patent No.: US 6,726,802 B2
(45) Date of Patent: Apr. 27, 2004

(54) PLASMA PROCESSING APPARATUS

(75) Inventors: Takamitsu Tadera, Nara (JP); Tatsushi Yamamoto, Ikoma-gun (JP); Masaki Hirayama, Sendai (JP); Tadahiro Ohmi, 2-1-17-301, Komegafukuro, Aoba-ku, Sendai-shi, Miyagi (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 70 days.

(21) Appl. No.: 10/211,498

(22) Filed: Aug. 2, 2002

(65) Prior Publication Data

US 2003/0024647 A1 Feb. 6, 2003

(30) Foreign Application Priority Data

Aug. 6, 2001 (JP) ........................................ 2001-237880

(51) Int. Cl.[7] ........................... H05H 1/00; C23C 16/00; H01J 21/00
(52) U.S. Cl. .......................... 156/345.41; 118/723 MW; 315/111.21
(58) Field of Search ....................... 156/345.41, 345.42; 118/723 MW, 723 MA, 723 AN; 315/111.21

(56) References Cited

U.S. PATENT DOCUMENTS 5,411,591 A * 5/1995 Izu et al. .................... 118/718
6,189,481 B1 * 2/2001 Akimoto ............. 118/723 MW
6,286,454 B1   9/2001 Hirayama et al. .......... 118/723
6,607,633 B2 * 8/2003 Noguchi ................. 156/345.41

FOREIGN PATENT DOCUMENTS

| JP | 2001-49442 | 2/2001 |
| JP | 2001-135627 A | 5/2001 |

* cited by examiner

Primary Examiner—Parviz Hassanzadeh
(74) Attorney, Agent, or Firm—David G. Conlin; David A. Tucker; Edwards & Angell, LLP (57) ABSTRACT

A plasma processing apparatus includes a slot plate having a slot-formed region for passing microwave from a waveguide to a microwave entrance window, and a slot plate drive unit driving the slot plate to change the position of the slot plate with respect to the microwave entrance window. The slot plate is thus moved with respect to the microwave entrance window to change at least one of the position, number and area of slot openings where the microwave is passed. The plasma processing apparatus accordingly ensures uniform plasma processing even if the process condition significantly changes when films on a large-area substrate or wafer to be processed are made of different materials or a stacked-layer film composed of layers of different materials is to be processed.

8 Claims, 11 Drawing Sheets

PLASMA PROCESSING APPARATUS

BACKGROUND OF THE INVENTION

1. Field of the Invention

The present invention relates to a plasma processing apparatus used in manufacturing semiconductor devices or liquid crystal displays, the plasma processing apparatus being employed as an apparatus for etching or depositing films by means of a plasma generated through excitation by microwave.

2. Description of the Background Art

A plasma processing technique which uses the microwave is applied to a process of manufacturing a semiconductor or TFT (Thin Film Transistor) liquid crystal substrate. This plasma processing technique is now in wide use because of a high plasma density as well as easy control of ion energy.

It is generally difficult, however, to uniformly generate the plasma over a large area. In addition, with recent increase in demand for semiconductor and TFT liquid crystal substrates as well as increased size of process substrates, a demand for a higher production efficiency and a demand for technique of uniform plasma-processing for a large-sized substrate are growing.

In order to satisfy such demands, some plasma processing apparatuses use a slot plate. A plasma processing apparatus using a slot plate is described below in conjunction with FIG. 10.

Figure 10:
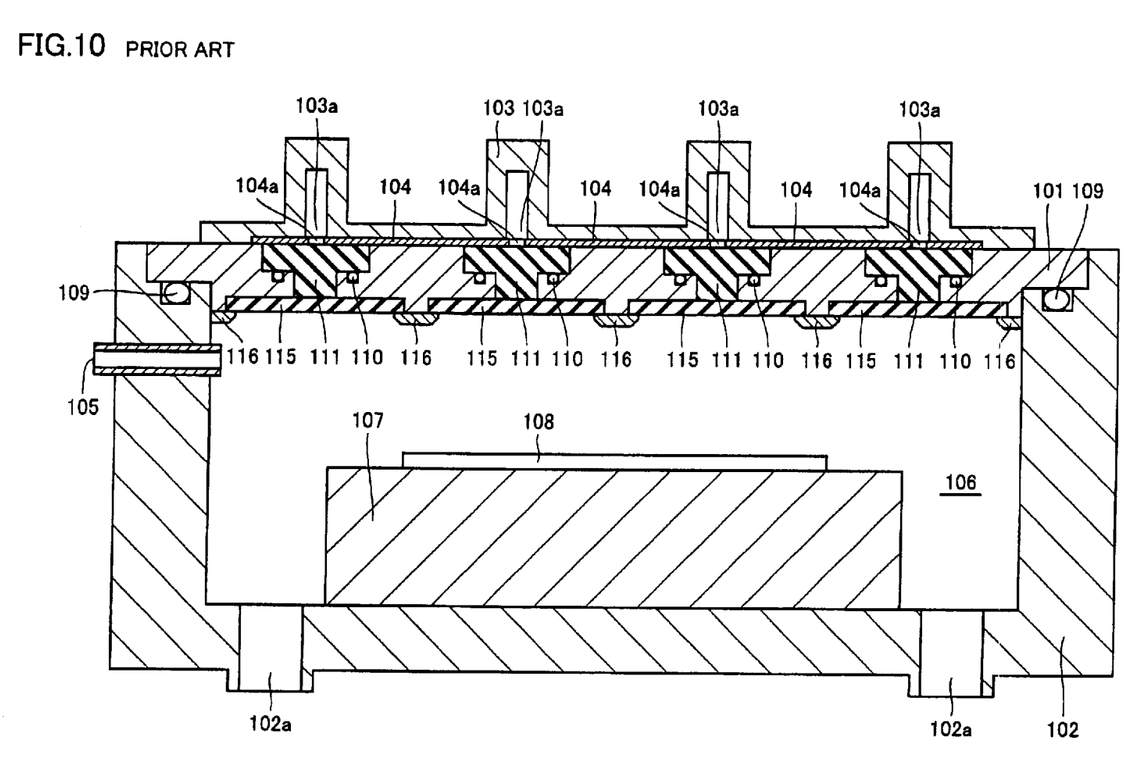
FIG. 10 schematically shows a structure of a conventional plasma processing apparatus in a cross section in the direction of the shorter side of a waveguide.

FIG. 10 shows a structure of a conventional plasma processing apparatus employing a slot plate, the structure being shown in a cross section in the direction of the shorter side of a waveguide. Referring to FIG. 10, a chamber body 102 has a top chamber lid 101 placed via an O ring 109 to seal a process chamber 106 and keep a vacuum within process chamber 106. A substrate holder 107 on which a substrate to be processed (hereinafter substrate) 108 is placed is provided in process chamber 106. Further, a rectangular microwave entrance window 111 made of such a dielectric as alumina is formed in top chamber lid 101 via an O ring 110.

Onto the vacuum side of top chamber lid 101, a dielectric plate 115 is fastened by a dielectric plate fastening member 116. Microwave entrance window 111 and dielectric plate 115 are fastened to contact each other. A vacuum is created in process chamber 106 by removing air from an opening 102a in the bottom of chamber body 102 by means of a vacuum pump (not shown). Chamber body 102 further has a gas inlet 105 provided for taking in a reactant gas.

A waveguide 103 is placed on top chamber lid 101. A microwave generator (not shown) is connected to waveguide 103. A metal slot plate 104 having a plurality of slots 104a is provided between microwave entrance window 111 and waveguide 103.

Figure 11:
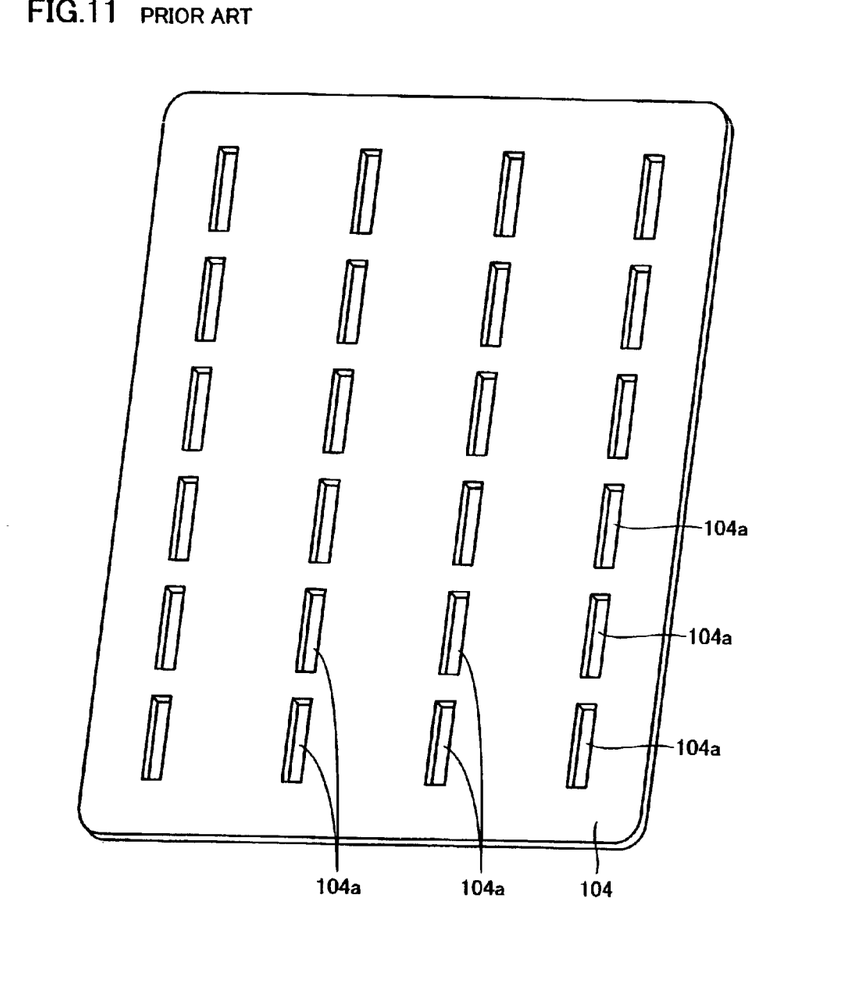
FIG. 11 is a perspective view of a slot plate of the plasma processing apparatus shown in FIG. 10.

Referring to FIG. 11, rectangular slots 104a are formed in a region corresponding in position to an opening of waveguide 103. Slots 104a are accordingly placed between the waveguide opening 103a and microwave entrance window 111. Slots 104a are positioned and sized appropriately so that a uniform plasma process is achieved under a certain process condition.

When this conventional plasma processing apparatus is operated, microwave is generated by the microwave generator (not shown), supplied through waveguide 103, slots 104a of slot plate 104 and microwave entrance window 111, and radiated from dielectric plate 115 into process chamber 106, in order to change a reactant gas supplied from gas inlet 105 into a plasma. The plasma thus excited is used to plasma-process substrate 108. As the slots 104a are positioned and sized most appropriately, substrate 108 is uniformly processed by the plasma.

In recent years, such multilayer films as two-layer and three-layer films have been used each as a material of a liquid crystal or semiconductor device. In addition, respective areas of liquid crystal substrates and semiconductor wafers have been increasing. Accordingly, a large-area workpiece formed of various types of films is often processed uniformly by a plasma successively in the same process chamber. Problems of such a process are described below in connection with a dry etching process.

Suppose that films made of different materials are to be etched or films made of the same material require different etching performances (e.g. shape, selectivity). Then, a process gas, an etching mode and an etching apparatus appropriate for each film must be selected, resulting in decrease of versatility of the apparatus.

Suppose that a film constituted of stacked layers of different materials is to be etched. If an apparatus and a condition that are most suitable for any layer of a certain material are selected in terms of the best uniformity, the best uniformity could not be achieved for other layers of materials different from that certain material. Consequently, a favorable uniformity cannot be achieved for the entire stacked-layer film.

Moreover, when isotropic etching and anisotropic etching are combined for etching a material into a desired shape, different process conditions, process gases for example, are necessary. In such a case, under significantly different conditions, it is difficult for a microwave plasma source to allow various materials on a large-area substrate or wafer to be etched into desired shapes by using one slot pattern.

SUMMARY OF THE INVENTION

One object of the present invention is to provide a plasma processing apparatus keeping the uniformity in a plasma process under significantly different process conditions, for example, when films of different materials on a large-area substrate or wafer are to be processed or a film composed of stacked layers of different materials is to be processed.

According to the present invention, a plasma processing apparatus includes a process chamber, a microwave generating unit, a waveguide, a slot plate and a slot plate drive unit. The process chamber has a wall partially formed of a microwave entrance window made of a dielectric, for performing a plasma process in the process chamber. The microwave generating unit generates microwave. The waveguide supplies the microwave generated by the microwave generating unit into the process chamber via the microwave entrance window. The slot plate has a slot-formed region for passing the microwave from the waveguide to the microwave entrance window. The slot plate drive unit drives the slot plate to change the position of the slot plate with respect to the microwave entrance window. The slot-formed region has openings through which microwave is passed, and the slot plate is moved with respect to the microwave entrance window to change at least one of the position, number and area of the openings of the slot-formed region.

The plasma processing apparatus of the present invention has the slot plate moved with respect to the microwave entrance window so that at least one of the position, number and area of the openings, which pass the microwave therethrough, of the slot-formed region of the slot plate can be changed. Then, for each process, the most appropriate state of the slot openings is provided. The process is thus carried out uniformly with stability.

With regard to the plasma processing apparatus, preferably the slot-formed region has a plurality of slots formed per the microwave entrance window and arranged in the direction in which the slot plate is moved, and the slot plate is moved to select, from those slots, slots passing the microwave and slots passing no microwave.

Accordingly, the most appropriate slots can be selected from a plurality of slots for each process so that the process can be carried out under the optimum condition.

With regard to the plasma processing apparatus, preferably the microwave entrance window has an open face in the shape of a rectangle on the wall of the process chamber, the slot plate is movable in the direction of the shorter side of the rectangle and, from those slots arranged in the direction of the shorter side, slots passing the microwave and slots passing no microwave are selected.

The slot plate is thus moved in the direction of the shorter side of the open face to select appropriate slots, which means that the distance of movement of the slot plate is shorter than that when the slot plate is moved in the direction of the longer side of the open face.

With regard to the plasma processing apparatus, preferably the slot plate is moved to change the slots passing the microwave, when plasma processes are successively performed on one and the same workpiece under a plurality of process conditions.

The most appropriate state of the slot openings is provided for these process conditions. The processes are thus carried out uniformly with stability.

Preferably, the plasma processing apparatus is used for processing the workpiece having stacked films by plasma.

As the processes are carried out uniformly with stability, each of the stacked films can be processed under the optimum condition.

With regard to the plasma processing apparatus, in the slot-formed region, a slot is preferably formed having its opening changed in at least one of the area and position with respect to the direction in which the slot plate is moved.

The state of the slot opening is thus controlled by moving the slot plate.

With regard to the plasma processing apparatus, preferably a plurality of microwave entrance windows are arranged in the form of a matrix in parallel with each other on the wall of the process chamber.

The state of slot openings can thus be controlled over a wide range in the process chamber.

In the plasma processing apparatus, preferably the slot plate and the slot plate drive means are provided per the waveguide.

Then, the state of slot openings can be controlled for each waveguide.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

First Embodiment

Figure 1:
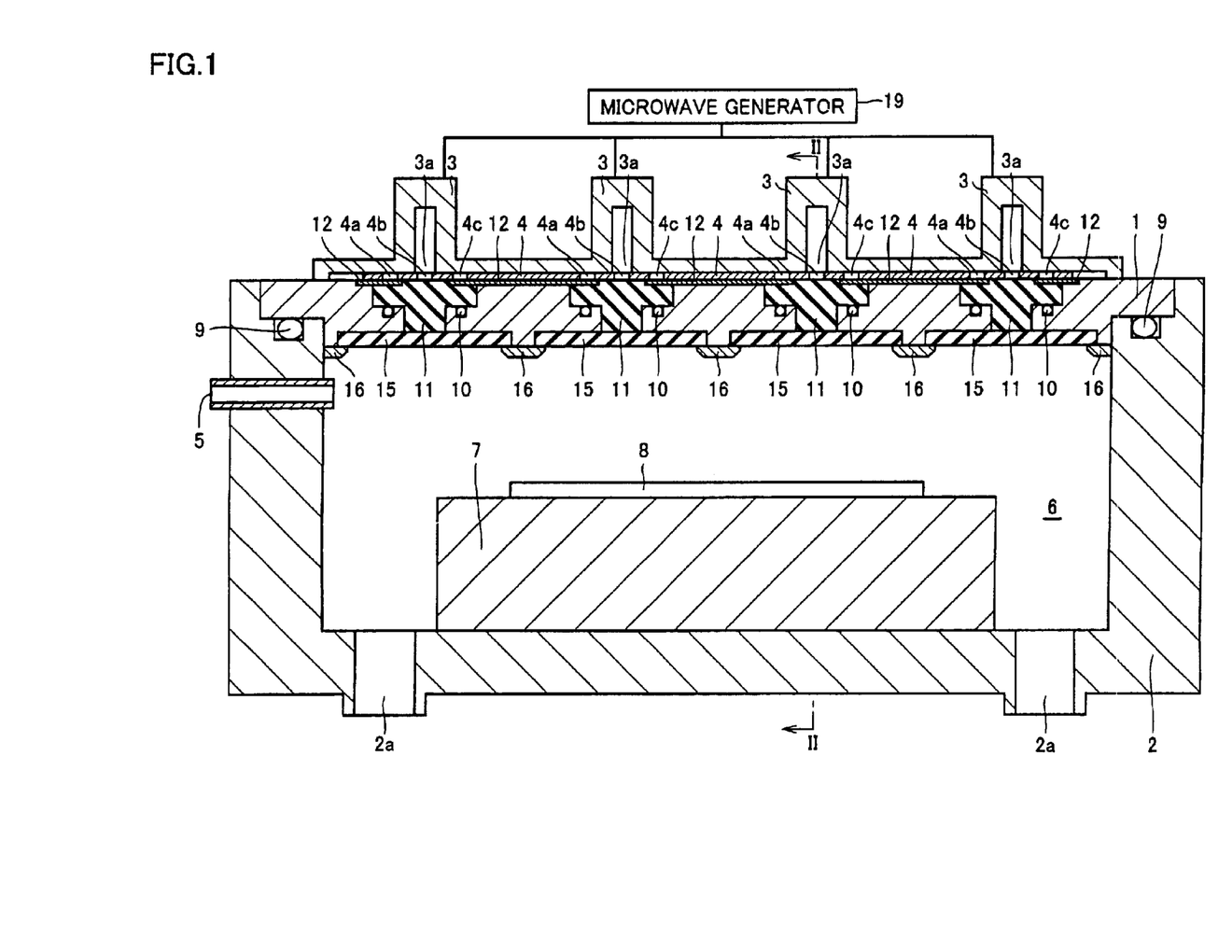
FIG. 1 schematically shows a structure of a plasma processing apparatus according to a first embodiment of the present invention, the apparatus shown in a cross section in the direction of the shorter side of a waveguide corresponding to the cross section along line I—I in FIG. 2.
Figure 2:
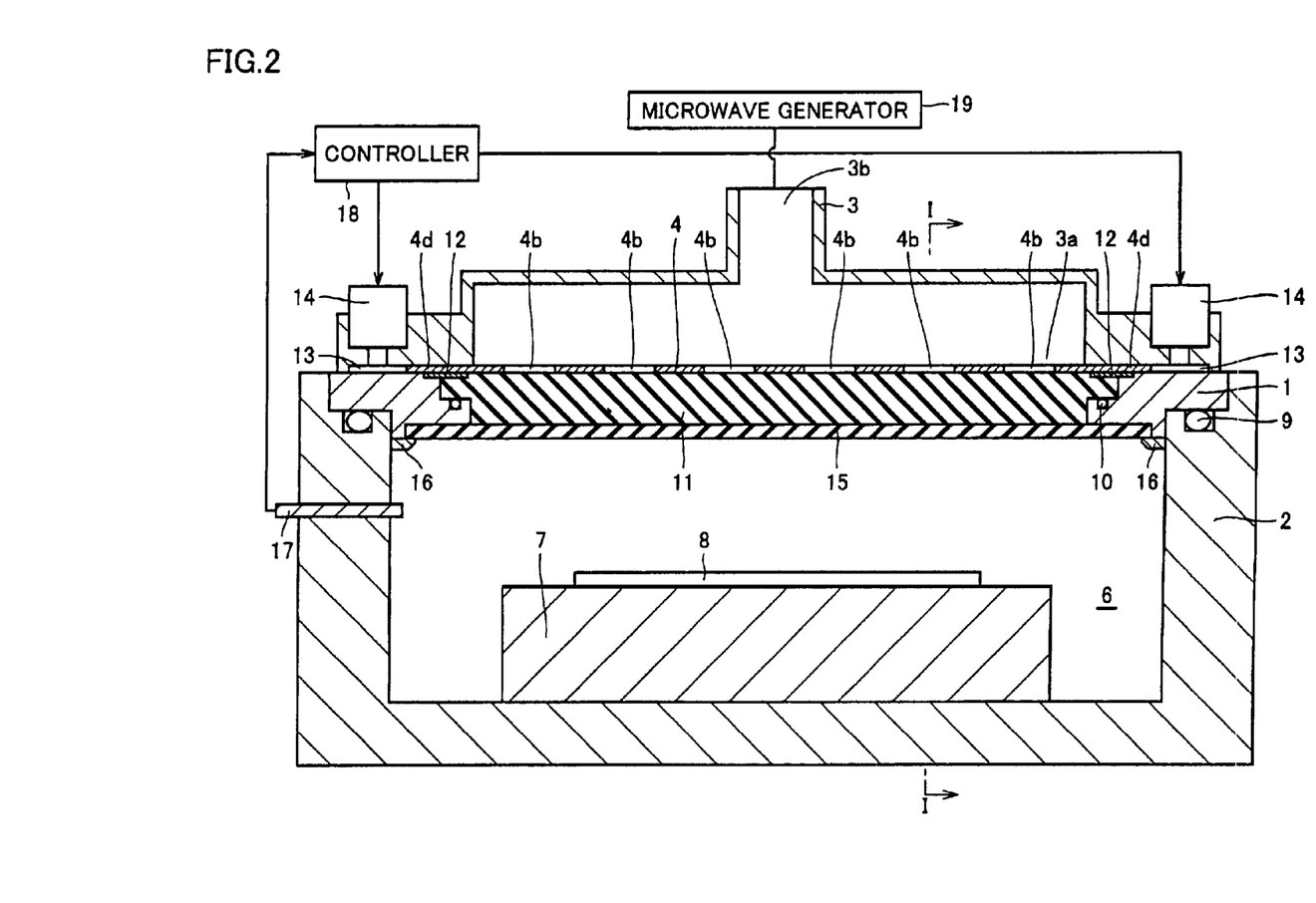
FIG. 2 schematically shows the structure of the plasma processing apparatus according to the first embodiment of the present invention, the apparatus shown in a cross section in the direction of the longer side of the waveguide corresponding to the cross section along line II—II in FIG. 1.
Figure 3:
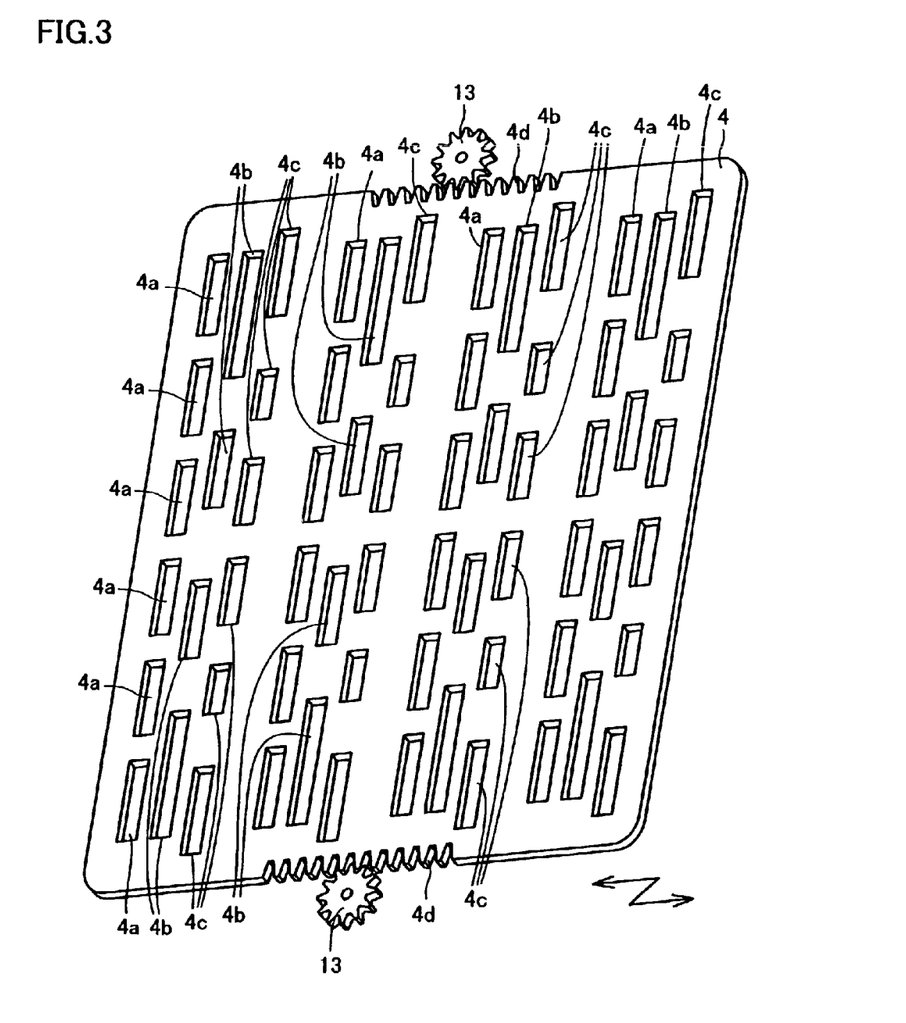
FIG. 3 is a perspective view of a structure of a slot plate and a slot plate drive mechanism used for the plasma processing apparatus shown in FIGS. 1 and 2.

A first embodiment of the present invention is described in conjunction with FIGS. 1 to 3.

Referring to FIGS. 1 and 2, a plasma processing apparatus according to the first embodiment chiefly includes a top chamber lid 1, a chamber body 2, a waveguide 3, a slot plate 4, a substrate holder 7, a microwave entrance window 11, an entrance window holding member 12, a drive gear 13, a drive motor 14, a dielectric plate 15, a dielectric plate fastening member 16, an end point detector 17, a controller 18 and a microwave generator 19.

On chamber body 2, top chamber lid 1 is placed via an O ring 9 to seal a process chamber 6 and keep a vacuum within process chamber 6. On the bottom surface of chamber body 2, substrate holder 7 is placed to face top chamber lid 1, and a substrate 8 is mounted on substrate holder 7.

In top chamber lid 1, a rectangular microwave entrance window 11 constituted of such a dielectric as alumina is formed. This microwave entrance window 11 is fastened to top chamber lid 1 by entrance window holding member 12. An O ring 10 is provided between top chamber lid 1 and microwave entrance window 11 for sealing process chamber 6 and keeping a vacuum within process chamber 6.

An opening 2a in the bottom of chamber body 2 is connected to a vacuum pump (not shown). The vacuum pump removes air from the inside of process chamber 6 to create a vacuum in process chamber 6. Chamber body 2 has a gas inlet 5 for taking in a reactant gas.

Top chamber lid 1 has a lower surface which faces process chamber 6, and dielectric plate 15 is fastened to this lower surface by dielectric plate fastening member 16. Microwave entrance window 11 and dielectric plate 15 are in contact with each other all the time, and microwave is thus propagated from microwave entrance window 11 to dielectric plate 15. On the upper surface of top chamber lid 1, a waveguide 3 is provided having an upper opening 3b connected to microwave generator 19. Accordingly, microwave generated by microwave generator 19 is propagated from the upper opening 3b in waveguide 3 to waveguide opening 3a.

A metal slot plate 4 is provided between microwave entrance window 11 and waveguide 3, and a slot plate drive unit for sliding slot plate 4 is placed on top chamber lid 1. The slot plate drive unit is constituted of drive gear 13 and drive motor 14. Drive motor 14 generates power which is transmitted via drive gear 13 to a rack 4d of slot plate 4 to drive slot plate 4.

Referring to FIG. 3, a plurality of sets of slots 4a, 4b and 4c (i.e. a set of slots 4a, a set of slots 4b and a set of slots 4c) are arranged in slot plate 4 in the direction of the shorter side of waveguide 3. The sets of slots 4a, 4b and 4c are each composed of a plurality of slots arranged in the direction of the longer side of waveguide 3, arranged and sized appropriately for any of different process conditions. Specifically, when a film is constituted of stacked layers that are etched successively by the same apparatus, etching is performed on different layers in one etching process, which means that different process conditions are adopted in respective etching stages. Here, each of the process conditions includes the type of reactant gas, the flow rate of the gas, the pressure of the gas, and the power of microwave to be supplied, for example. Different process conditions respectively require appropriate slot arrangements and sizes. Therefore, a set of slots is provided for each process condition. For example, if three process conditions are necessary, three sets of slots 4a, 4b and 4c are provided as shown in FIG. 3.

Slot plate 4 is mounted on waveguide 3 to move freely in the direction indicated by the arrow shown in FIG. 3. At the edge of slot plate 4, rack 4d is formed having its teeth engaged with drive gear 13 connected to drive motor 14. Slot plate 4 is thus driven by the power of motor 14. Rotation of drive motor 14 causes slot plate 4 to move in the direction of the shorter side of waveguide 3 and accordingly slots 4a, 4b and 4c of slot plate 4 slide under waveguide opening 3a. Any of the sets of slots 4a, 4b and 4c is thus positioned directly under waveguide opening 3a.

In this way, a set of slots that is most suitable for each process condition is positioned under waveguide opening 3a. Then, successive processing steps such as etching steps may be performed for a stacked-layer film for example under the optimum conditions.

Although three sets of slots 4a, 4b and 4c are provided according to this embodiment, the number of slot sets is not limited to three and may be any which is necessary for a desired process.

In order to prevent the microwave from leaking to the atmosphere and prevent undesired discharge, a sufficient electrical conduction is established between slot plate 4, waveguide 3, entrance window holding member 12 and upper lid 1.

Description is given below of an operation of the plasma processing apparatus used as an etching apparatus according to this embodiment.

The inside of process chamber 6 is kept in a vacuum state by a vacuum pump (not shown) connected to opening 2a of chamber body 2. The microwave from microwave generator 19 is directed from upper opening 3b of waveguide 3 into waveguide opening 3a and passed through the set of slots 4b of slot plate 4. As microwave entrance window 11 made of such a dielectric as alumina allows the microwave to pass therethrough, the microwave passed through the set of slots 4b is passed through microwave entrance window 11 to be radiated from the front surface, which faces process chamber 6, of dielectric plate 15 into process chamber 6.

Prior to the radiation of the microwave into process chamber 6, a process gas is supplied into process chamber 6 from reactant gas inlet 5 provided to a side of process chamber 6 in the upper part, and a predetermined gas pressure is set in process chamber 6. In this state, the microwave is radiated into process chamber 6 to produce a plasma within process chamber 6. Then, the generated plasma is used to plasma-process substrate 8 held on substrate holder 7.

It is supposed here that three films of different materials respectively are stacked on substrate 8. Then, a first uppermost film is etched first, a second film under the first film is etched next, and then a third film under the second film is etched. The first, second and third films are made of different materials respectively, and thus these films require respective process conditions different from each other. The process conditions each include the type of process gas for etching, the gas flow rate and the gas pressure for example. The process condition is changed in the transition from the etching for the first film to the etching for the second film and changed in the transition from the etching for the second film to the etching for the third film.

The sets of slots 4b, 4a and 4c of slot plate 4 are positioned and sized for allowing uniform etching to be performed on the entire surface of a large-sized substrate or wafer under respective etching process conditions for the first, second and third films. Thus, the set of slots 4b is adopted for etching the first uppermost film, the set of slots 4a is adopted for etching the following second film, and the set of slots 4c is adopted for the third lowermost film to uniformly etch the entire surface of the substrate.

First, plasma processing for the first film is carried out by the plasma generated by the microwave passed through the set of slots 4b. The emission of plasma for example is observed by end point detector 17. End point detector 17 accordingly detects that the etching for the first film is completed to send a detection signal to controller 18. According to the information from end point detector 17, controller 18 changes the etching process condition, such as the type of process gas, the gas pressure and the power to be supplied, to an etching process condition suitable for the second film. At the same time, controller 18 drives drive motor 14 to move slot plate 4 so that the slots 4a of the slot set are positioned to overlap waveguide opening 3a.

After the process condition is determined and slot plate 4 is moved, the second film is processed. In the similar manner to that for the first film, it is detected that the etching for the second film is completed, the etching process condition is changed to the one appropriate for the third film, and simultaneously, slot plate 4 is moved by the slot plate drive mechanism so that the slots 4c of the slot set are positioned to overlap waveguide opening 3a. Then, the third film is processed. In this way, the stacked-layer film consisting of stacked layers (films) of different materials is processed by the plasma successively under the optimum process conditions.

Although the end of the process for each film is detected by the end point detector 17 according to this embodiment, the detection method is not limited to the particular one described above. The time required for a process may be managed to detect that the process is completed.

A large-area substrate or wafer is thus etched uniformly by selecting an optimum etching condition and a set of slots according to each material of a film as discussed above.

The embodiment has been discussed in connection with the stacked-layer film constituted of layers (films) of different materials. However, this embodiment is not limited to etching of such a particular stacked-layer film. More specifically, the process condition should be changed in one process if one substrate is isotropically and anisotropically etched appropriately. In such a case, several sets of slots are provided for processing the substrate uniformly under respective process conditions. Then, a set of slots is changed to another set of slots in changing the process condition to uniformly process the large-area substrate.

As discussed above, the plasma processing apparatus of this embodiment may be used to successively process a large-area substrate or wafer by means of the plasma uniformly under a plurality of process conditions.

Second Embodiment

A second embodiment of the present invention is now described in connection with FIGS. 4 and 5.

Figure 4:
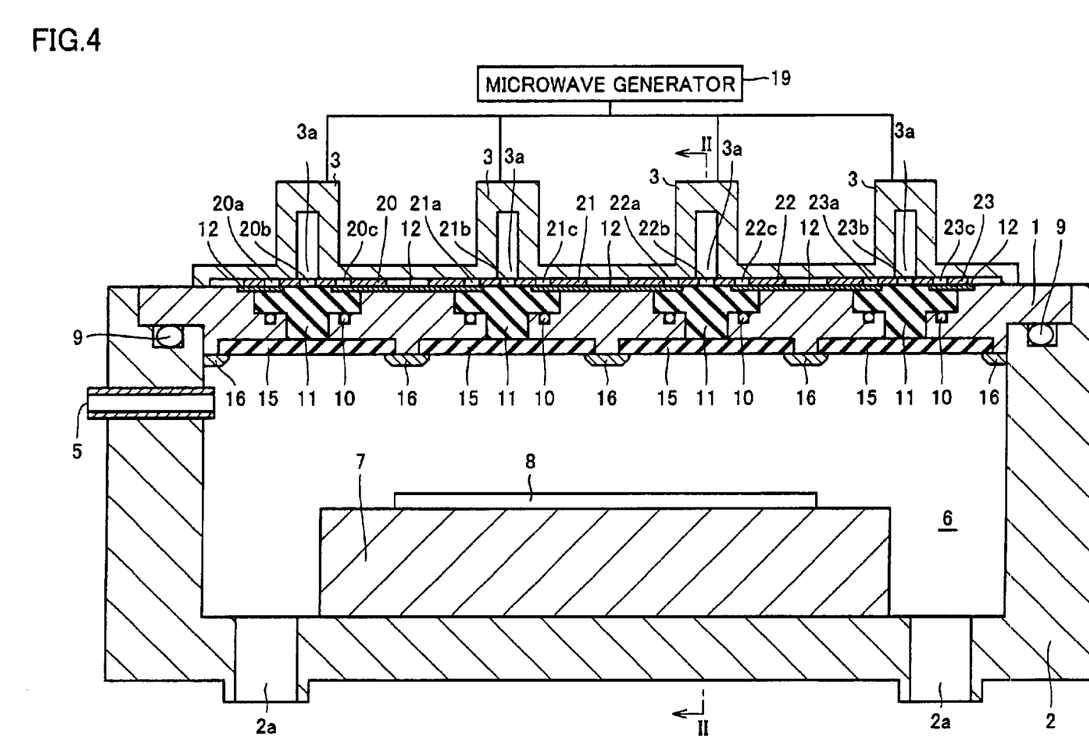
FIG. 4 schematically shows a structure of a plasma processing apparatus according to a second embodiment of the present invention, the apparatus shown in a cross section in the direction of the shorter side of a waveguide.
Figure 5:
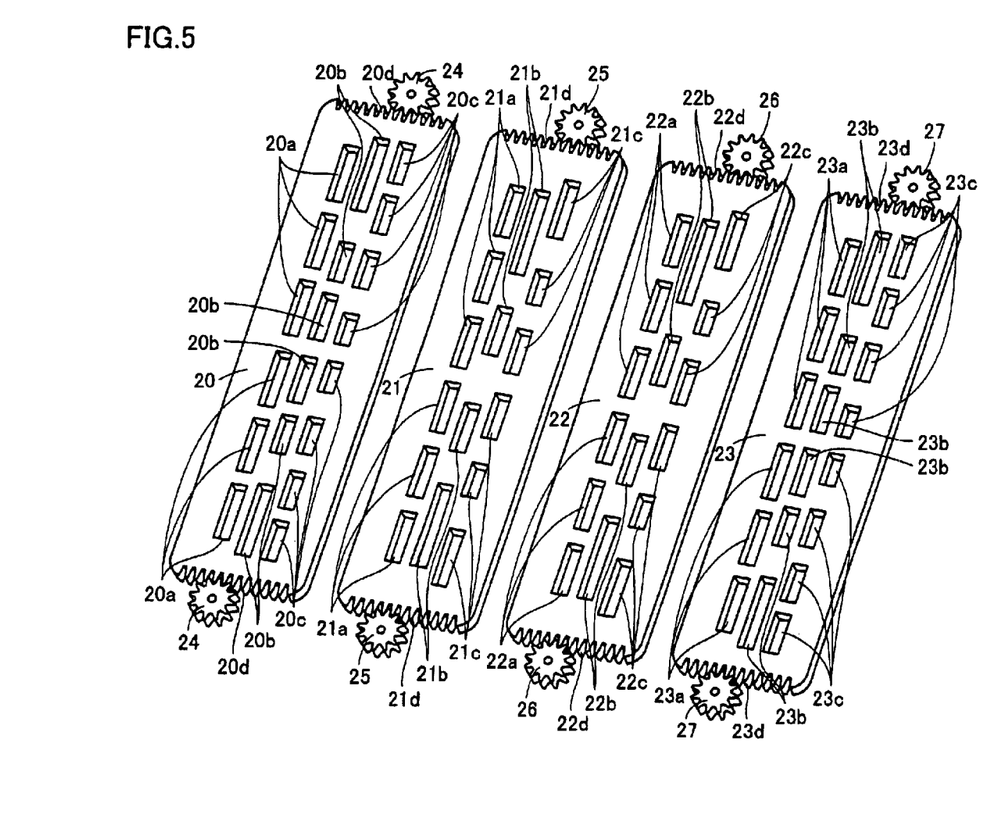
FIG. 5 is a perspective view of a structure of a slot plate and a slot plate drive mechanism used for the plasma processing apparatus shown in FIG. 4.

Referring to FIGS. 4 and 5, the structure of this embodiment differs from that of the first embodiment only in that a plurality of slot plates and slot plate drive units are provided for the second embodiment. Slot plates 20, 21, 22 and 23 respectively have sets of slots 20a–20c, sets of slots 21a–21c, sets of slots 22a–22c and sets of slots 23a–23c. Slot plates 20, 21, 22 and 23 are each slidable under corresponding waveguide openings 3a. Slots plates 20, 21, 22 and 23 are driven by the power from slot plate drive means that is transmitted to respective rack units 20d, 21d, 22d and 23d via drive gears 24, 25, 26 and 27.

Respective positions of slot plates 20, 21, 22 and 23 are controlled independently of each other. Specifically, only the slot plates 20 and 23 may be driven, only the slot plates 21 and 22 may be driven or only one of the slot plates 20, 21, 22 and 23 may be driven. Therefore, when the process condition is changed, a set of slots maybe selected for each waveguide, which means that there are increased alternatives in selecting slots for any plasma process condition.

It is noted that the cross section along line II—II in FIG. 4 is the same in structure as that shown in FIG. 2 and thus the cross section of this embodiment is not provided here. In addition, components except for those described above are substantially the same as those of the first embodiment detailed above. Here, the same components are denoted by the same reference character and description thereof is not repeated.

The plasma processing apparatus of this embodiment used as an etching apparatus operates almost similarly to that of the first embodiment except that the positions of slots plates 20, 21, 22 and 23 are controlled independently of each other.

Accordingly, the plasma processing apparatus of this embodiment controls respective positions of slot plates 20, 21, 22 and 23 independently of each other to successively process a large-area substrate or wafer by means of the plasma uniformly under a plurality of process conditions.

Third Embodiment

Figure 6:
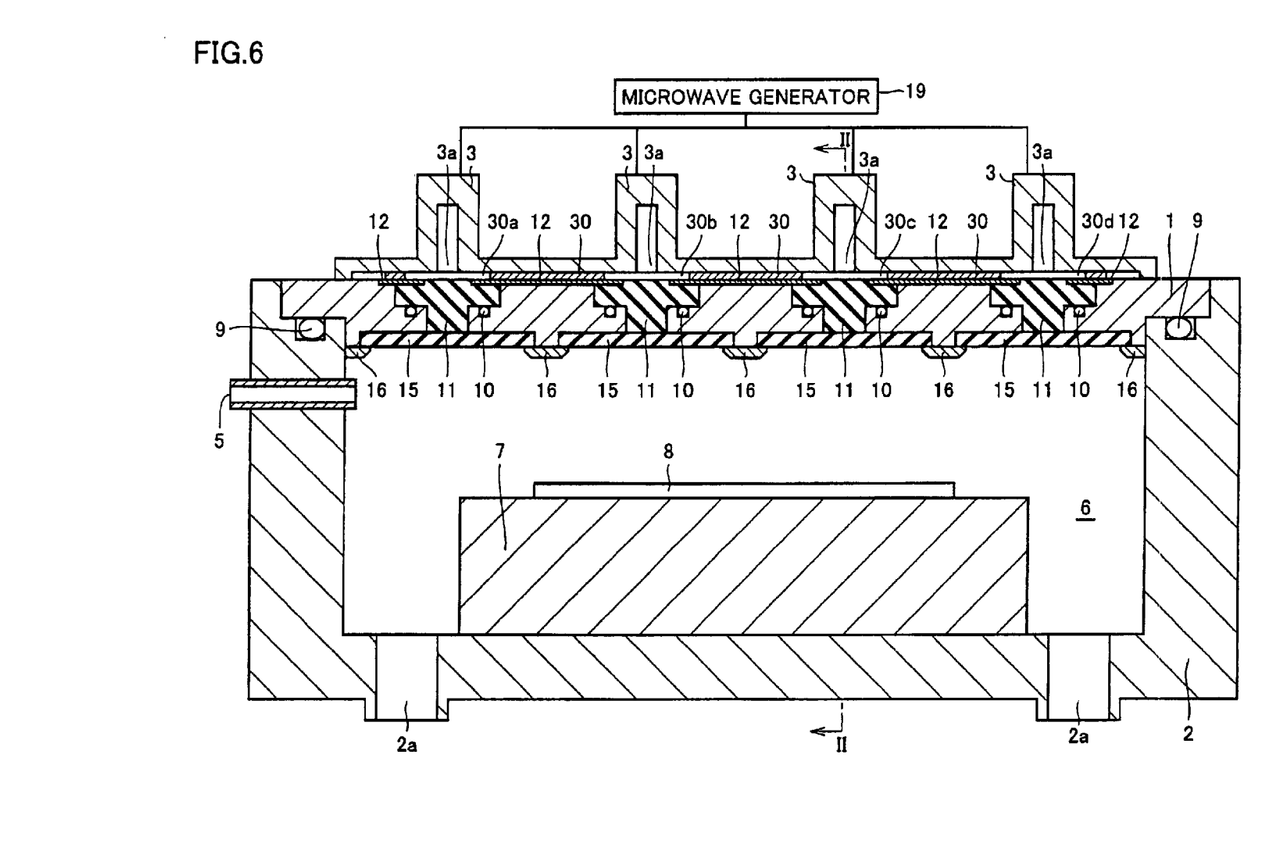
FIG. 6 schematically shows a structure of a plasma processing apparatus according to a third embodiment of the present invention, the apparatus shown in a cross section in the direction of the shorter side of a waveguide.
Figure 7:
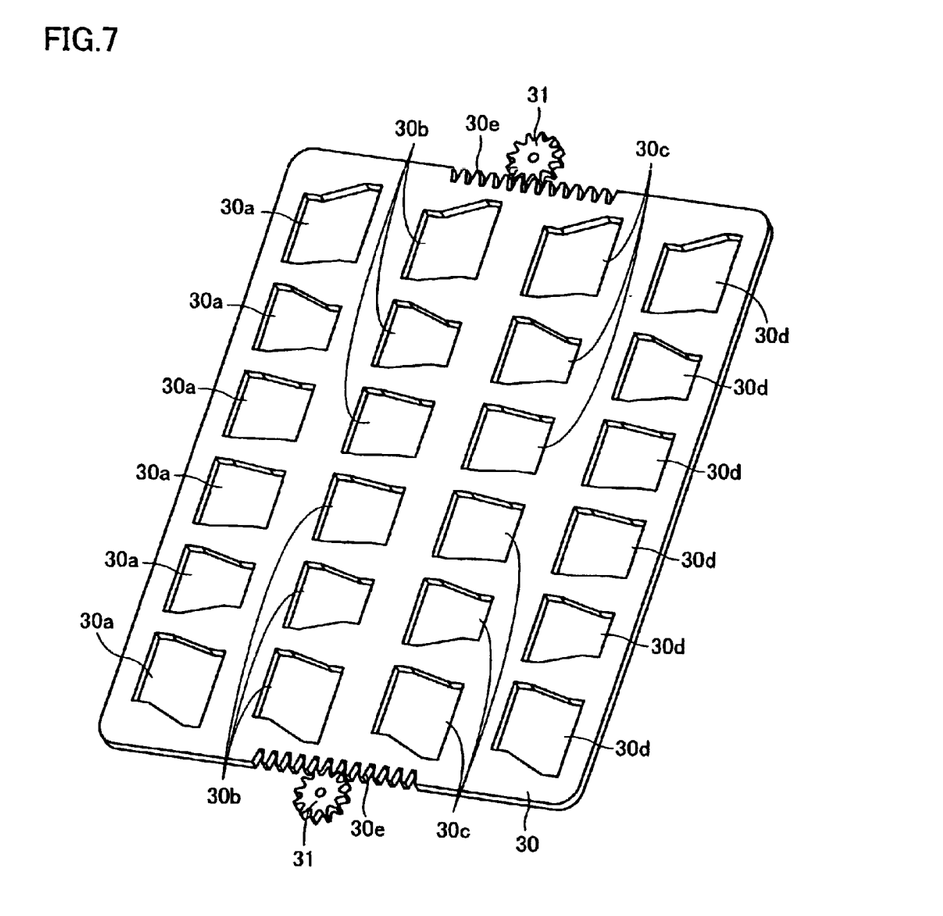
FIG. 7 is a perspective view of a structure of a slot plate and a slot plate drive mechanism used for the plasma processing apparatus shown in FIG. 6.
Figure 8:
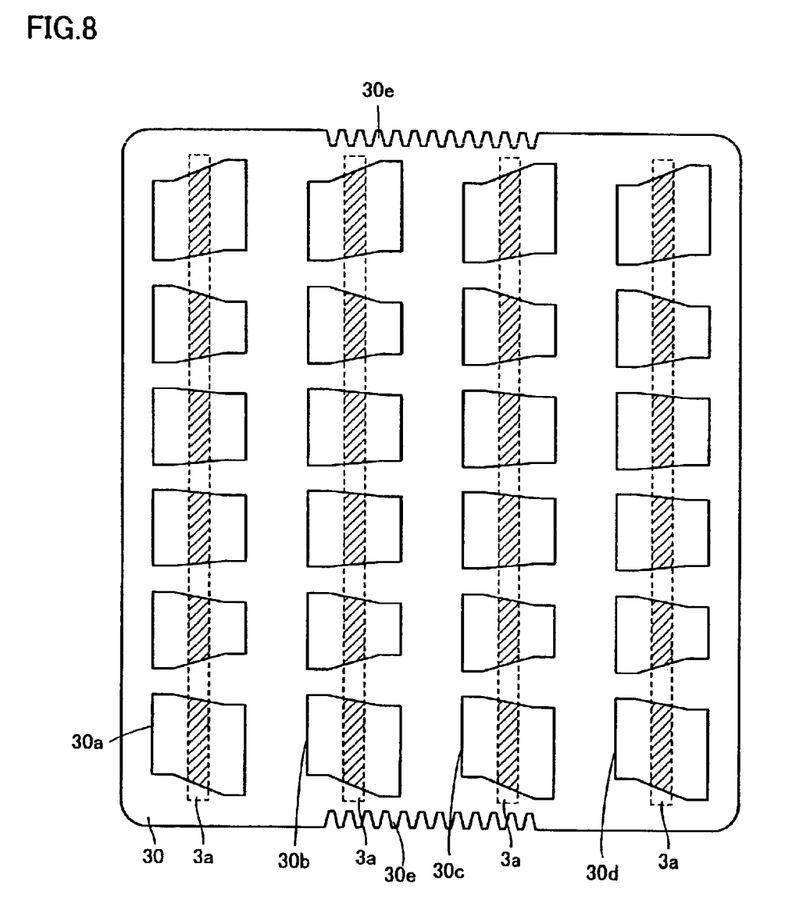
FIG. 8 shows an arrangement of slots of the slot plate with respect to openings of waveguides, used for the plasma processing apparatus shown in FIG. 6.

A third embodiment of the present invention is described in conjunction with FIGS. 6–8.

Referring to FIGS. 6–8, the structure of this embodiment differs from that of the first embodiment in that the former has a set of slots 30a, 30b, 30c or 30d in a line for each waveguide 3. Sets of slots 30a, 30b, 30c and 30d each include slots shaped to allow, at least one of the area of the slot opening and the position of the slot opening, to be changed relative to the direction in which slot plate 30 slides (the direction of the shorter side in the cross section of waveguide 3).

Waveguide openings 3a and slots 30a, 30b, 30c and 30d of the slot sets are arranged with respect to each other as shown in FIG. 8. Each slot of the sets of slots 30a, 30b, 30c and 30d has a larger width than that of waveguide opening 3a in the direction in which slot plate 30 slides. The hatched part in FIG. 8 represents an opening where opening 3a and slot 30a, 30b, 30c or 30d overlap.

Slot plate 30 is slidable under waveguide 3. Slot plate 30 is driven by the power transmitted from the slot plate drive mechanism via a drive gear 31 to a rack 30e of slot plate 30.

It is noted that the cross section along line II—II in FIG. 6 is the same in structure as that shown in FIG. 2 and thus the cross section of this embodiment is not provided here. In addition, components except for those described above are substantially the same as those of the first embodiment detailed above. Here, the same components are denoted by the same reference character and description thereof is not repeated.

The plasma processing apparatus of this embodiment used as an etching apparatus operates almost similarly to that of the first embodiment except that a set of slots in a line is provided for each waveguide 3 and the slots in a line successively change in the position and size.

According to this embodiment, slot plate 30 may slide to successively change the positions and sizes of openings of the slots arranged in a line for one waveguide 3. Then, fine adjustments of the positions and sizes of the slots is possible in a process. Moreover, when the process condition is changed, the slots may be changed without interruption. The process condition can thus be changed with the discharge maintained.

As discussed above, the plasma processing apparatus of this embodiment may be used to successively process a large-area substrate or wafer by means of the plasma uniformly under a plurality of process conditions.

Although the first to third embodiments are described in connection with the plasma processing apparatuses used as etching apparatuses, the plasma processing apparatuses of the present invention are not limited to such a particular use and may be designed as a CVD (chemical Vapor Deposition) apparatus.

Figure 9:
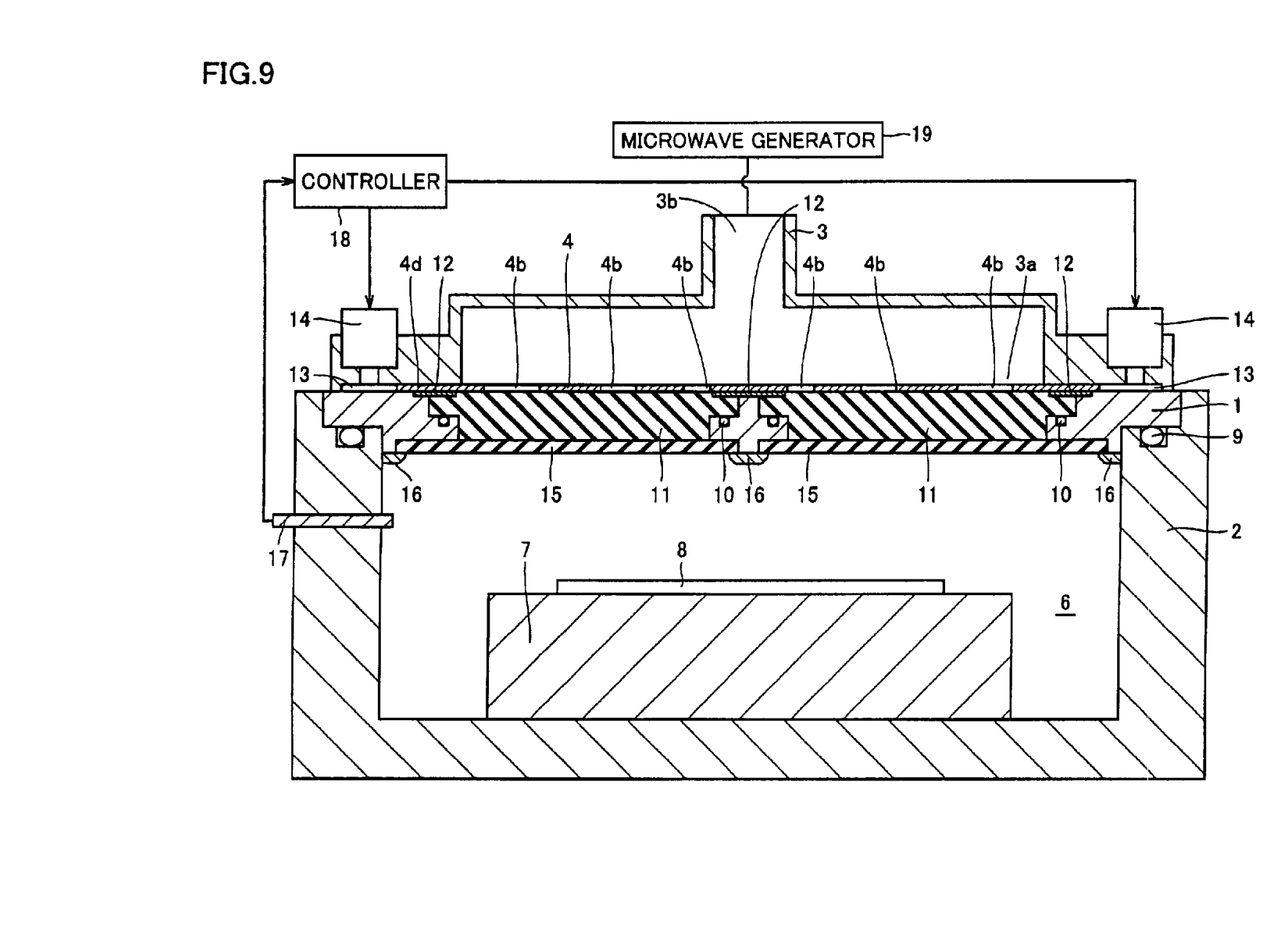
FIG. 9 schematically shows a structure of any of the plasma processing apparatuses of the first to third embodiments, the apparatus shown in a cross section in the direction of the shorter side of the waveguide, and a microwave entrance window of the plasma processing apparatus being divided in the direction of the longer side of the waveguide.

In addition, according to the above-discussed first to third embodiments, microwave entrance window 11 is not divided in the direction of the longer side of waveguide 3 as shown in FIG. 2. However, microwave entrance window 11 may be divided into two or at least three parts in the direction of the longer side of waveguide 3 as shown in FIG. 9. In this case, dielectric plate 15 is also divided in the direction of the longer side of waveguide 3 as microwave entrance window 11.

As heretofore discussed, the plasma processing apparatus of the present invention moves the slot plate relative to the microwave entrance window to change at least one of the position, number and area of the openings of slots through which the microwave is passed. Then, for each process, the optimum state of slot openings is established. Accordingly, a uniform process is achieved with stability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
   a process chamber having a wall partially formed of a microwave entrance window made of a dielectric, for performing a plasma process in said process chamber;
   microwave generating unit for generating microwave;
   a waveguide for supplying the microwave generated by said microwave generating unit into said process chamber via said microwave entrance window;
   a slot plate having a slot-formed region for passing the microwave from said waveguide to said microwave entrance window; and
   slot plate drive unit for driving said slot plate to change the position of said slot plate with respect to said microwave entrance window, wherein
   said slot-formed region has openings through which the microwave is passed, and said slot plate is moved with respect to said microwave entrance window to change at least one of the position, number and area of the openings of said slot-formed region.

2. The plasma processing apparatus according to claim 1, wherein
   said slot-formed region has a plurality of slots formed per said microwave entrance window and arranged in the direction in which said slot plate is moved, and said slot plate is moved to select, from said plurality of slots, slots passing the microwave and slots passing no microwave.

3. The plasma processing apparatus according to claim 2, wherein
   said microwave entrance window has an open face in the shape of a rectangle on the wall of said process chamber, said slot plate is movable in the direction of the shorter side of said rectangle and, from said plurality of slots arranged in the direction of the shorter side, slots passing the microwave and slots passing no microwave are selected.

4. The plasma processing apparatus according to claim 2, wherein
   said slot plate is moved to change the slots passing the microwave, when plasma processes are successively performed on one and the same workpiece under a plurality of process conditions.

5. The plasma processing apparatus according to claim 4 used for processing the workpiece having stacked films by plasma.

6. The plasma processing apparatus according to claim 1, wherein
   in said slot-formed region, a slot is formed having its opening changed in at least one of the area and position with respect to the direction in which said slot plate is moved.

7. The plasma processing apparatus according to claim 1, wherein
   a plurality of said microwave entrance windows are arranged in the form of a matrix in parallel with each other on the wall of said process chamber.

8. The plasma processing apparatus according to claim 7, wherein
   said slot plate and said slot plate drive unit are provided per said waveguide.

* * * * *